(12) United States Patent
Shafer

(10) Patent No.: US 6,912,042 B2
(45) Date of Patent: Jun. 28, 2005

(54) 6-MIRROR PROJECTION OBJECTIVE WITH FEW LENSES

(75) Inventor: David R. Shafer, Fairfield, CT (US)

(73) Assignee: Carl Zeiss SMT AG (DE)

( * ) Notice: Subject to any disclaimer, the term of this patent is extended or adjusted under 35 U.S.C. 154(b) by 0 days.

(21) Appl. No.: 10/402,316

(22) Filed: Mar. 28, 2003

(65) Prior Publication Data

US 2003/0234992 A1 Dec. 25, 2003

Related U.S. Application Data

(60) Provisional application No. 60/368,180, filed on Mar. 28, 2002.

(51) Int. Cl.$^7$ .......................... G03B 27/54; G02B 17/00
(52) U.S. Cl. .......................... 355/67; 359/365; 359/366
(58) Field of Search ..................... 355/67; 359/365, 359/366; 250/492.2

(56) References Cited

U.S. PATENT DOCUMENTS

| 4,701,035 A | 10/1987 | Hirose ........................ 350/505 |
| 5,686,728 A | 11/1997 | Shafer ....................... 250/492.2 |
| 5,815,310 A | 9/1998 | Williamson .................. 359/365 |
| 2002/0056815 A1 * | 5/2002 | Mann et al. .............. 250/492.2 |
| 2003/0197922 A1 * | 10/2003 | Hudyma ...................... 359/359 |

FOREIGN PATENT DOCUMENTS

| EP | 0 779 528 | 6/1997 |
| EP | 0 778 528 | 3/2003 |
| EP | 1 069 448 | 3/2003 |
| WO | WO 01/51979 | 7/2001 |

* cited by examiner

Primary Examiner—Rodney Fuller
(74) Attorney, Agent, or Firm—Ohlandt, Greeley, Ruggiero & Perle

(57) ABSTRACT

There is provided a projection objective for wavelengths of $\leq 193$ nm for imaging an object field in an object plane into an image field, in an image plane. The projection objective includes a first reflective optical element, a second reflective optical element, a third reflective optical element, a fourth reflective optical element, a fifth reflective optical element, and a sixth reflective optical element, and at least one refractive optical element. The refractive optical elements has a used area with a diameter. The projection objective has an image-side numerical aperture $\geq 0.65$, and the used area of the refractive optical element has a diameter that is less than $\frac{1}{3}^{rd}$ of the distance from the object plane to the image plane.

56 Claims, 3 Drawing Sheets

6-MIRROR PROJECTION OBJECTIVE WITH FEW LENSES

CROSS REFERENCE TO RELATED APPLICATIONS

The present application is claiming priority of U.S. Provisional Patent Application Serial No. 60/368,180, filed on Mar. 28, 2002.

BACKGROUND OF THE INVENTION

1. Field of the Invention

This invention relates to a projection objective for short wavelengths, preferably of ≦193 nm, especially ≦157 nm, and also to a projection exposure apparatus and a chip production, each of which employs such a projection objective.

2. Description of the Related Art

Lithography with wavelengths of <193 nm is discussed as a possible technique for imaging structures of <130 nm and with special preference <100 nm. The resolution of a lithographic system is described by the following equation:

$$RES = k_1 \cdot (\lambda/NA)$$

wherein $k_1$ is a specific parameter of the lithographic process, $\lambda$ is the wavelength of the incident light, and NA is the numerical aperture of the system on the image side.

For imaging systems in the wavelength region of <193 nm, essentially reflective components are available in addition to refractive components made of fluorides.

Purely reflective systems with six mirrors for microlithography with wavelengths of <193 nm have been disclosed by the publications U.S. Pat. No. 5,686,728 and EP 0 779,528, and U.S. Pat. No. 5,815,310.

The projection lithography system according to U.S. Pat. No. 5,686,728 shows a projection objective with six mirrors, with each of the reflective mirror surfaces being of aspherical design. The mirrors are arranged along a common optical axis in such a way that an obstruction-free light path is achieved.

To reduce the residual errors of the objective and to achieve larger apertures at the outlet pupil, EP-A-0 779,528 suggests introducing three refractive optical elements into the beam path. A drawback of this embodiment with few lenses is, that the image-side numerical aperture NA is equal to 0.6, and the refractive optical elements have large diameters, which is undesirable with respect to availability of materials and costs, as well as manufacturing feasibility. It is another drawback that the refractive optical elements are off-axis segments, which are difficult to mount and to align.

An objective that is similar to that from EP-A-0 778,528 is described in U.S. Pat. No. 4,701,035. FIG. 12 of U.S. Pat. No. 4,701,035, for example, shows an objective with nine mirrors, two lenses, and two intermediate images. The objective that is described in U.S. Pat. No. 4,701,035 has essentially the same drawbacks as the system known from EP-A-0 779,528, i.e. a small image-side numerical aperture. Furthermore, the optical elements, as in EP-A-0 778,528, are difficult to mount and to align.

Catadioptric projection objectives have been disclosed by EP-A-1,069,448 and WO-A-01/51979 with an image-side numerical aperture of NA >0.6. The objectives disclosed by both EP-A-1,069,448 and WO-A-01/51979 are systems centered around an optical axis, with the number of refractive elements always being greater than that of reflective elements. A drawback to these systems is their use of much lens material.

SUMMARY OF THE INVENTION

It is thus the object of this invention to describe a projection objective device suitable for lithography at short wavelengths that does not have the drawbacks of the prior art mentioned above; particularly one that makes available a high image-side numerical aperture with minimal use of lens material.

In addition to this, the optical elements should be readily mounted and easy to align.

According to the invention, the object is solved in a first embodiment of the invention by the fact that in a projection objective with six reflective optical elements and at least one refractive optical element, the image-side numerical aperture NA is ≧0.65 and the refractive optical elements have a used diameter D of the off axis segments, the so called used area, of a optical element—that is smaller than $\frac{1}{3}^{rd}$ of the distance of the object plane from the image plane, preferably less than $\frac{1}{4}^{th}$, and with special preference less than $\frac{1}{5}^{th}$ of the distance of the object plane from the image plane. In the present application, the used diameter D of the off-axis segment means the diameter of the circular envelope that encloses the off axis segment, the so called used area of a optical element, on the particular reflective or refractive component. The circular envelope is always the smallest circle that encloses the off-axis segment of a optical element. The off axis segment of a optical element is also denoted as optical footprint.

In an especially preferred embodiment of the invention, the objective is of very compact design with a total structural length of less than 700 mm, preferably 500 mm. The refractive optical elements have a diameter D of the off axis segment of the optical element that is smaller than 120 mm. Such refractive optical elements can be produced substantially easier than refractive elements with large lens diameters, such as those disclosed by EP-A-0 779,528, for example.

In particular, the material needs for lens material and the machinability of the lens material, for example, $CaF_2$, is simpler with small diameters of the off axis segments of refractive components.

In an especially preferred embodiment of the invention, the projection objective comprises three refractive optical elements, with two of the three refractive optical elements being positioned in the beam path from the object plane to the image plane, after the sixth reflective element. The surface of the refractive optical element that is closest to the image plane in the beam path is preferably of aspherical design.

In an especially preferred embodiment, it is shown that refractive elements in a definite portion of the off axis segment can also be used simultaneously as reflective optical elements, i.e. Mangin mirrors.

For technological reasons it is especially preferred for only five of the six reflective optical components to be of aspherical design, and for the reflective optical component whose off axis segment has the greatest distance from the optical axis of the projection objective to be of spherical design. The off axis segment of the projection objective denotes the area of a mirror that is illuminated on the mirror when the object plane of the projection objective is illuminated with a segment of an annular field. The distance of the off axis segment to the optical axis is the radial distance of the center point of the off axis segment to the optical axis HA of the projection objective. The center point of the off axis segment is given by the center point of the annular field that illuminates the off axis segment of a mirror.

In an especially preferred embodiment of the invention, the physical diaphragm is positioned on or near the second reflective optical component in the beam path from the object plane to the image plane. In alternative configurations, the physical diaphragm can be positioned between the first and second reflective optical components or between the second and third reflective optical components in the beam path from the object plane to the image plane.

In another embodiment of the invention, an intermediate image Z is formed in the beam path from the object plane to the image plane, in a plane conjugated to the object plane. The intermediate image is preferably formed in the beam path from the object plane to the image plane after the fourth reflective optical component. The intermediate image divides the projection system into two sub-objectives, a first sub-objective comprising first optical elements that are positioned in the beam path from the object plane to a plane conjugated to the object plane, and a second sub-objective comprising second optical elements that are positioned in the beam path from the conjugated plane to the image plane. According to the invention, the first and second sub-objectives each comprise no more than three refractive optical elements. It is especially preferred for the first sub-objective to be designed so that the object in the object plane is imaged in the real intermediate image in the plane conjugated to the object plane with a reduction ratio β that is approximately |β|=1, and the second sub-objective images the real intermediate image in an image of the object in the image plane with a reduction ratio |β|<1, preferably |β|<0.25.

Besides the projection objective, the invention also makes available a projection exposure apparatus, wherein the projection exposure apparatus comprises a lighting device for lighting a field, preferably an annular field, and a projection objective according to the invention. The invention will be described below with reference to the examples of embodiment by way of example.

DESCRIPTION OF THE INVENTION

Figure 1:
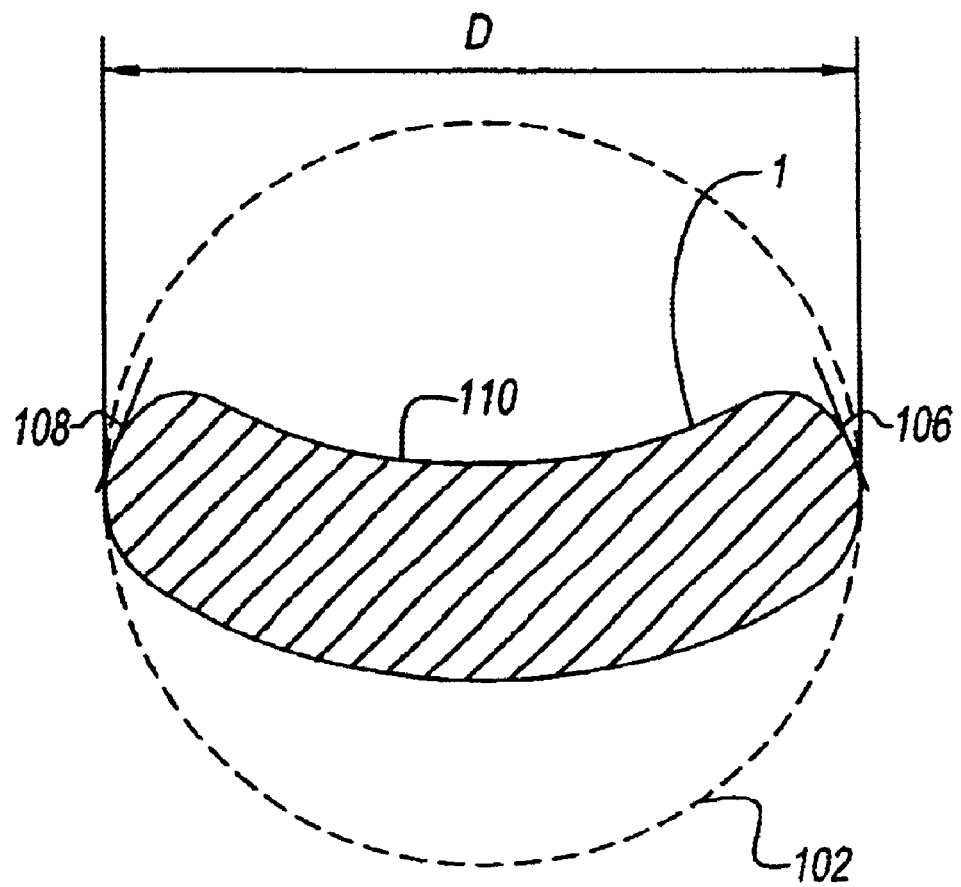
FIG. 1: the off axis segment of a reflective or refractive element.

FIG. 1 illustrates what is meant in the present application by the off axis segment and the diameter of the off axis segment.

FIG. 1 by way of example shows a kidney-shaped field for a kidney-shaped illuminated field 1 on a reflective or refractive element of the projection objective. Such a shape for the off axis segment is expected when using the objective according to the invention in a microlithography projection exposure apparatus when the object plane is illuminated with a segment of an annular field. The circular envelope 102 fully encloses the kidney shape and coincides at two points 106, 108, with the edge 110 of the kidney shape. The circular envelope is always the smallest circle that encloses the off axis segment. The diameter D of the off axis segment is then found from the diameter of the circular envelope 102.

Figure 2:
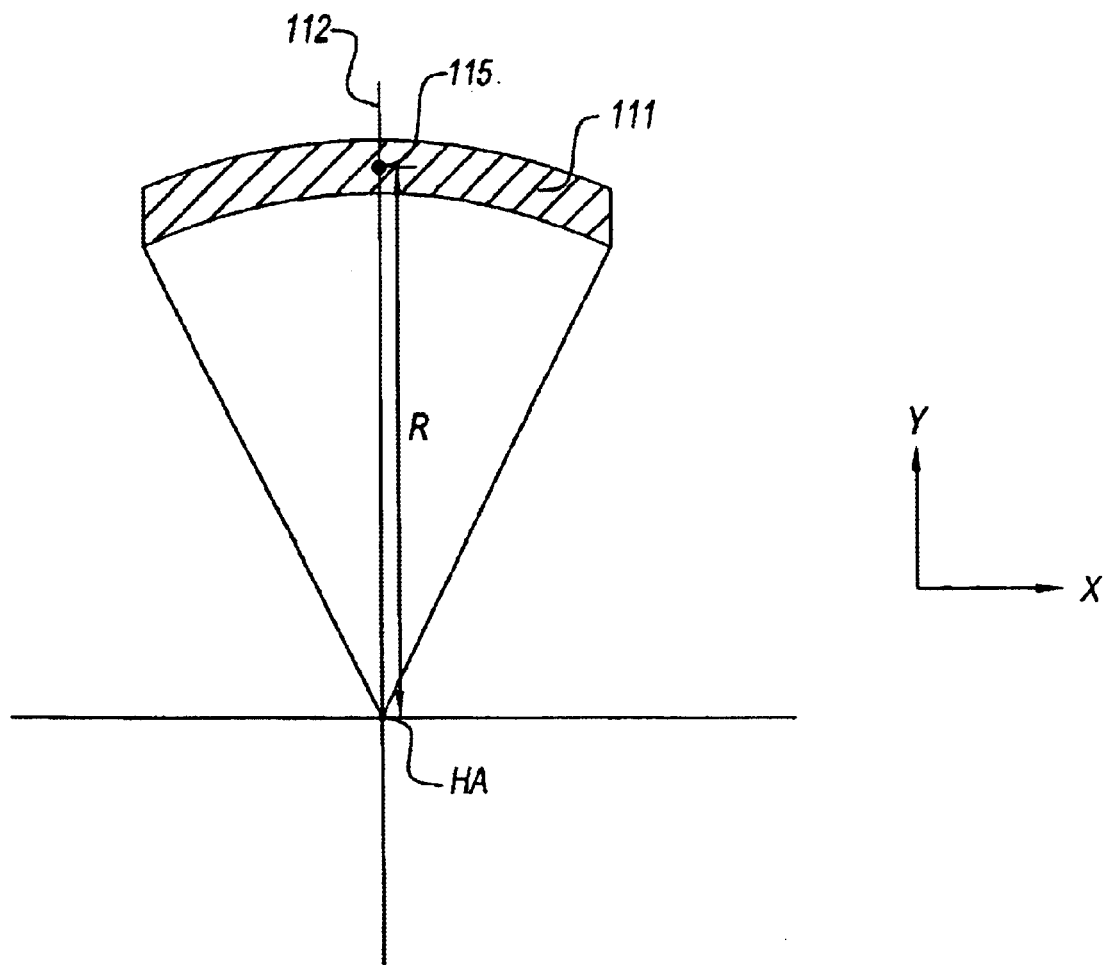
FIG. 2: the annular field in the object plane of the objective.

FIG. 2 illustrates the object field 111 of a projection exposure apparatus in the object plane of the projection objective that is imaged using the projection objective according to the invention in an image plane in which a light-sensitive object is positioned, for example a wafer. The image field in the image plane itself has the same shape as the object field, but reduced in size by the reduction ratio. The object field or image field 111 has the configuration of a segment of an annular field. The segment has an axis of symmetry 112.

Also shown in FIG. 2 are the axes defining the object plane, namely the x-axis and the y-axis. As shown in FIG. 2, the axis of symmetry 112 of the annular field 111 runs in the direction of the y-axis. Furthermore, the y-axis coincides with the scanning direction of a projection exposure apparatus, which is designed as a scanner. The x-direction is then the direction that is perpendicular to the scanning direction within the object plane. The annular field has a so-called central annular-field radius R that is defined by the distance of the center point 115 of the image field to the optical axis HA of the projection objective.

Figure 3:
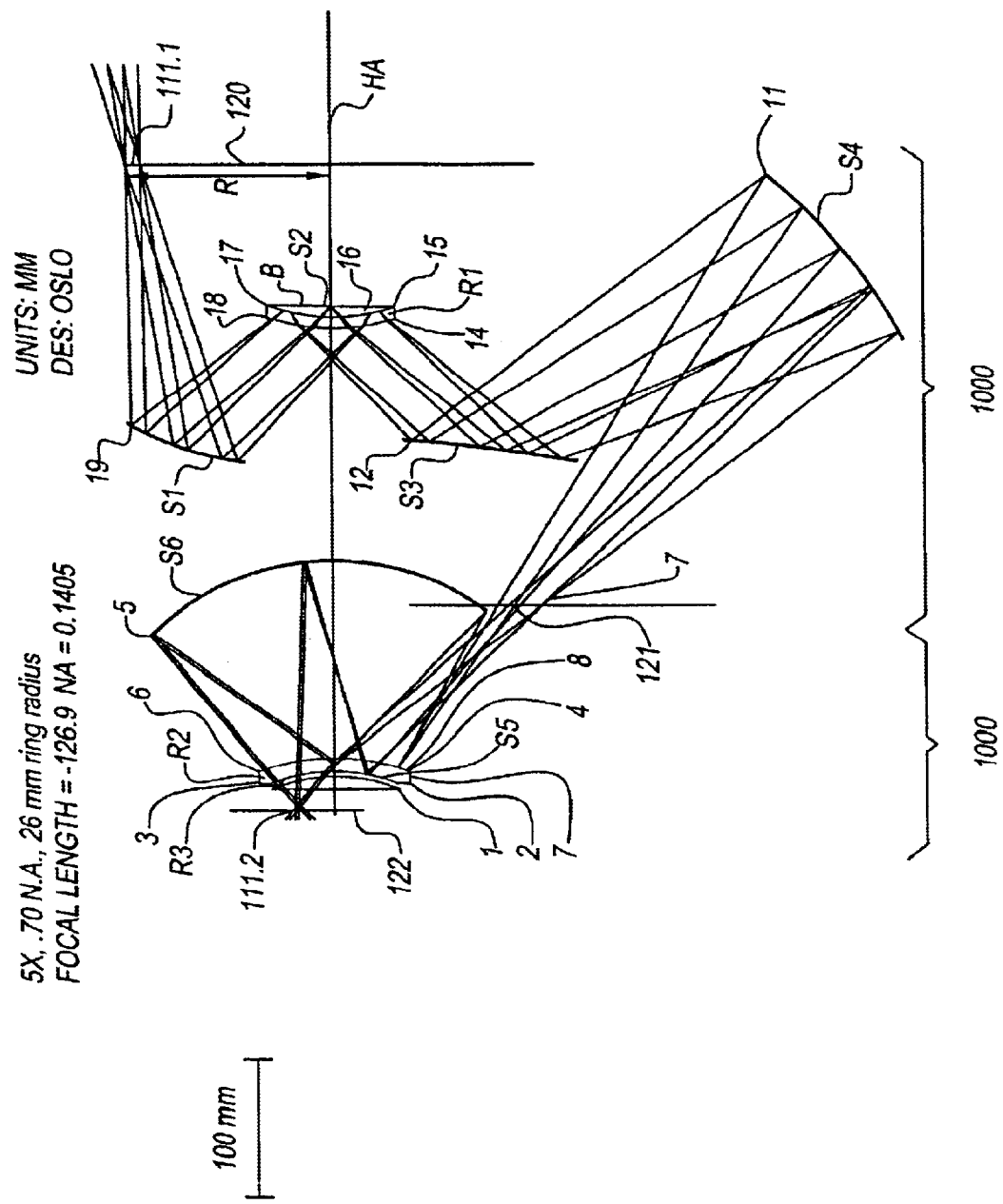
FIG. 3: an embodiment of a projection objective according to the invention with six reflective components and three refractive components.

FIG. 3 illustrates an embodiment of an objective according to the invention. The same reference symbols are used for the same structural elements as in FIGS. 1 and 2.

The annular field 111.1 in the object plane 120 of the microlithography projection objective is imaged by the objective in an image field 111.2 with the same geometry, but reduced in size by the reduction ratio, in the image plane 122 in which a light-sensitive object, for example a wafer, may be positioned. All of the optical components of the projection objective according to the invention are centered around the principal axis HA of the projection objective.

The projection objective overall has six reflective elements S1, S2, S3, S4, S5, and S6, as well as three refractive components R1, R2, and R3.

The exact optical data in the Code V format of the example of embodiment according to FIG. 3 are given in Table 1 below. The optical surfaces designated in Table 1 can be found from FIG. 3, viewing from left to right in FIG. 3 from the image plane 122 to the object plane 120.

| Surface | Radius | Thickness | Radius | Glass |
|---|---|---|---|---|
| 1 | −643.3667* | 10.000000 | 45.000000 | CaF$_2$ |
| 2 | −128.046493 | 3.208122 | 45.000000 | Air |
| 3 | −111.277787* | 8.000000 | 45.000000 | CaF$_2$ |
| 4 | −169.779824 | 140.540804 | 53.000000 | Air |
| 5 | −176.803646* | −140.540804 P | 125.000000 | Reflective* |
| 6 | −169.779824 P | −8.000000 P | 53.000000 | CaF$_2$ |
| 7 | −111.277787 P* | 8.000000 P | 45.000000 | Reflective* |
| 8 | −169.779824 P | 140.540804 P | 53.000000 | Air |
| 9 | −176.803646 P | 90.738754 | Reference surface | Air |
| 10 | −691.000000 | 303.815796 | Reference surface | Air |
| 11 | −453.599666 | −303.815796 P | 397.000000 | Reflective |
| 12 | −657.027593* | −24.383257 | 170.000000 | Reflective* |
| 13 | 310.000000 | 102.409564 | Reference surface | Air |
| 14 | 144.555780 | 8.000000 | 44.000000 | CaF$_2$ |
| 15 | 139.463643 | 5.939134 | 38.000000 | Air |
| 16 | 787.978516* | −5.939134 P | 36.000000 A | Reflective* |
| 17 | 139.463643 P* | −8.000000 P | 38.000000 | CaF$_2$ |
| 18 | 144.555780 P | −102.409564 P | 44.000000 | Air |
| 19 | 296.750971* | 102.409564 P | 140.000000 | Reflective* |
| 20 | −294.000000 | 117.224195 | 128.602525 S | Air |

*Aspherical surfaces
The refractive index of CaF$_2$ at 157.13 nm is 1.5597

Aspherical constants $$z = \frac{(CURV)y^2}{1 + \{1 - (1 + (AS\ 1)(CURV)^2 y^2\}^{1/2}} + (AS\ 2)y^4 + (AS\ 3)y^6 + (AS4)y^8 + (AD5)y^{10} + (AS6)y^{12} + (AS7)y^{14}$$

| AS 0 | AS 1 | AS 2 | AS 3 | AS 4 | AS 5 | AS 6 | AS 7 |
|---|---|---|---|---|---|---|---|
| Surface 1: | | | | | | | |
| 0.000000 | 0.000000 | 1.896607e−07 | 5.508863e−11 | −5.074820e−14 | 2.750264e−17 | −1.058341e−20 | 1.845283e-24 |
| Surface: 3 | | | | | | | |
| 0.000000 | 0.000000 | −2012845e−07 | −4.3979980e−11 | −6.979938e−15 | −2.3555673e−18 | −1.906964e−22 | −2.756038e−26 |
| Surface 5: | | | | | | | |
| 0.000000 | 0.000000 | −1.661477e−09 | −6.249171e−14 | −1.362672e−18 | −1.328683e−22 | 4.058739e−27 | −2.462428e−31 |
| Surface 7: | | | | | | | |
| 0.000000 | 0.000000 | −2.012845e−07 | −4.3979980e−11 | −6.979938e−15 | −2.3555673e−18 | −1.906964e−22 | −2.756038e−26 |
| Surface 12: | | | | | | | |
| 0.000000 | 0.000000 | 9.998657e−09 | −1.672379e−13 | 2.197020e−18 | −8.214423e−24 | −2.720911e−28 | 3.495656e−33 |
| Surface 15: | | | | | | | |
| 0.000000 | 0.000000 | 6.141170e−08 | −1.562833e−11 | −4.599874e−15 | −4.699896e−18 | −1.326383e−21 | −3.034362e−27 |
| Surface 16: | | | | | | | |
| 0.000000 | 0.000000 | −5.228692e−08 | −5.327721e−12 | −3.675170e−15 | 3.889630e−18 | 9.903743e−23 | 3.150874e−26 |
| Surface 17: | | | | | | | |
| 0.000000 | 0.000000 | 6.141170e−08 | −1.562833e−11 | −4.599874e−15 | −4.699896e−18 | −1.326383e−21 | −3.034362e−27 |
| Surface 19: | | | | | | | |
| 0.000000 | 0.000000 | −5.026510e−09 | 1.390563e−13 | −1.034164e−17 | 5.096479e−22 | −1.495436e−26 | 1.826561e−31 |

*Wavelength: 157.13 nm
Reduction ratio: 0.2
Image-side numerical aperture: 0.70

The projection objective according to FIG. 3 has an image-side numerical aperture of 0.70 with a reference wavelength of 157.13 mm. The annular field has a central annular-field radius R of 27 mm at the image. The overall structural length of the objective is less than 500 mm. Structural length in the present Application means the distance of the object plane 120 from the image plane 122. The first lens R1 closest to the object plane 120 has a diameter D of the off axis segment of 90 mm, the lens R3 closest to the image plane 122 has a diameter D of the off axis segment of 100 mm, and the largest lens of the system R2 has a diameter D of the off axis segment of 110 mm. It is preferred to use $CaF_2$ as lens material. Only five of the six reflective components are aspherical. The reflective component farthest from the optical axis HA, the mirror S4 here, is of spherical design. In contrast to this, in the projection objective according to EP-A-0 779,528 the mirror farthest from the optical axis HA is aspherical, which has considerable technical manufacturing disadvantages.

An intermediate image Z is formed in the embodiment shown in FIG. 3 between the fourth mirror and the fifth mirror. The physical diaphragm B according to the embodiment shown in FIG. 3 lies on the second mirror. The intermediate image lies in a plane 121 conjugated to the object plane 120. The first sub-objective or subsystem 1000 comprises the four mirrors S1, S2, S3, and S4 located in the beam path from the object plane 120 to the conjugated plane 121 and a single refractive optical element, the lens R1. The reduction ratio $\beta_1$ of the first sub-objective that images the object in the real intermediate image Z is $\beta_1$ approximately −1. The second sub-objective or subsystem 1002 comprises the two mirrors S5 and S6 in the beam path from the conjugated plane 121 to the image plane 122 as well as two refractive optical elements, the lenses R2 and R3. The reduction ratio $\beta_2$ of the second sub-objective that images the intermediate image in the conjugated plane 121 in the image plane 122, is smaller than 0.25 in magnitude. The overall projection objective has a reduction ratio of +0.2, i.e. the object field 111 in the object plane 120 is imaged in the image plane 122 reduced five times in size.

The invention for the first time describes a projection objective that is distinguished by the fact that with a very short structural length, a projection objective with large image-side numerical aperture can be described that is simple to manufacture.

What is claimed is:

1. A projection objective for wavelengths $\leq 193$ mm, for imaging an object field in an object plane into an image field in an image plane comprising:
   a first reflective optical element;
   a second reflective optical element;
   a third reflective optical element;
   a fourth reflective optical element;
   a fifth reflective optical element;
   a sixth reflective optical element; and
   at least one refractive optical element,
   wherein said at least one refractive optical element has a used area with a diameter,
   wherein said diameter of said used area of said at least one refractive optical element is less than $\frac{1}{3}^{rd}$ of a distance from said object plane to said image plane,
   wherein the projection objective has an image-side numerical aperture $\geq 0.65$, and
   wherein said distance from said object plane to said image plane is less than 700 mm.

2. The projection objective according to claim 1, wherein said projection objective has a plurality of refractive optical elements, each having a used area with a diameter of less than $\frac{1}{3}^{rd}$ of the distance from said object plane to said image plane.

3. The projection objective according to claim 2, wherein each of said diameters of said used areas of said plurality of refractive optical elements is < 200 mm.

4. The projection objective according to claim 1, wherein said diameter of said used areas of said at least one refractive optical element is <200 mm.

5. The projection objective according to claim 1, wherein said at least one refractive optical element is positioned after said second reflective optical element in a beam path from said object plane to said image plane.

6. The projection objective according to claim 1, further comprising second and third refractive optical elements, wherein two of said three refractive optical elements are positioned after said sixth reflective optical element in a beam path from said object plane to said image plane.

7. The projection objective according to claim 1, wherein a subregion of a lens surface of said at least one refractive optical element is used as a reflective optical element.

8. The projection objective according to claim 1, wherein said at least one refractive optical element comprises a lens material selected from the group consisting of an alkali-metal fluoride, an alkaline-earth fluoride, $CaF_2$, $BaF_2$, and LiF.

9. The projection objective according to claim 1, wherein said at least one refractive optical element is positioned centrally on an optical axis of said projection objective.

10. The projection objective according to claim 1, wherein no more than five of six surfaces of said first, second, third, fourth, fifth and sixth reflective optical elements are of aspherical design.

11. The projection objective according to claim 1, wherein said first, second, third, fourth, fifth or sixth reflective optical element that is farthest from said optical axis of said projection objective has a surface of spherical design.

12. The projection objective according to claim 1, wherein a physical diaphragm is positioned on or near said second reflective optical element.

13. The projection objective according to claim 1, wherein an intermediate image is formed after said fourth reflective optical element in a plane conjugated to said object plane in a beam path from said object plane to said image plane.

14. The projection objective according to claim 1, wherein said projection objective is a component of a projection exposure apparatus, wherein said projection exposure apparatus includes:
an illumination system; and
a first support system for supporting a mask,
wherein said mask has a structure,
wherein said mask is illuminated by said illumination system with radiation of a wavelength $\leq 193$ nm; and a light sensitive object positioned on a second support system, and
wherein said projection exposure apparatus employs said projection objective for imaging said structure of said mask on said light-sensitive object.

15. The projection objective according to claim 14, wherein said projection exposure apparatus is employed for producing structural components by using a method that includes:
positioning a light-sensitive object on said second support system;
illuminating a structured mask using an illumination system;
imaging said structure of said mask on a light-sensitive object using said projection objective; and
exposing said light sensitive object with radiation of wavelength of $\leq 193$ nm.

16. The projection objective of claim 1, wherein said diameter of said used area of said at least one refractive optical element is less than $1/4^{th}$ of a distance from said object plane to said image plane.

17. The projection objective of claim 1, wherein said diameter of said used area of said at least one refractive optical element is less than $1/5^{th}$ of a distance from said object plane to said image plane.

18. The projection objective according to claim 1, wherein said projection objective has a plurality of refractive optical elements, each having a used area with a diameter of less than $1/4^{th}$ of the distance from said object plane to said image plane.

19. The projection objective according to claim 1, wherein said projection objective has a plurality of refractive optical elements, each having a used area with a diameter of less than $1/5^{th}$ of the distance from said object plane to said image plane.

20. The projection objective of claim 1, wherein said distance from said object plane to said image plane is smaller than 500 mm.

21. A projection objective for wavelengths $\leq 193$ nm for imaging an object field in an object plane into an image field in an image plane comprising:
six reflective optical elements;
a plane conjugated to said object plane in which an intermediate image of said object field is formed;
a first sub-objective that includes a first subset of said six reflective optical elements positioned in a beam path from said object plane to said conjugated plane, with a first reduction ratio $\beta_1$; and
a second sub-objective that includes a second subset of said six reflective optical elements positioned in a beam path from said conjugated plane to said image plane, with a second reduction ratio $\beta_2$,
wherein said first reduction ratio $\beta_1$ has a magnitude of approximately 1, and
wherein said second reduction ratio $\beta_2$ has a magnitude of <1.

22. The projection objective according to claim 21, further comprising a refractive optical element having a used area with a diameter of less than $1/3^{rd}$ of the distance from said object plane to said image plane.

23. The projection objective according to claim 22, wherein said diameters of said used area of said refractive optical elements is < 200 mm.

24. The projection objective of claim 21, wherein said second reduction ratio has a magnitude $\beta_2 \leq 0.25$.

25. The projection objective according to claim 21, further comprising a plurality of refractive optical elements, each having a used area with a diameter of less than $1/3^{rd}$ of the distance from said object plane to said image plane.

26. The projection objective according to claim 25, wherein said diameter is < 200 mm.

27. The projection objective according to claim 25, wherein each of said plurality of refractive optical elements comprises a lens material selected from the group consisting of an alkali-metal fluoride, an alkaline-earth fluoride, $CaF_2$, $BaF_2$, and LiF.

28. The projection objective according to claim 25, wherein each of said plurality of refractive optical elements is positioned centrally on an optical axis of said projection objective.

29. The projection objective according to claim 21, further comprising two refractive optical elements positioned after a sixth reflective optical element in said beam path from said object plane to said image plane.

30. The projection objective according to claim 21, further comprising a refractive optical element that has a lens surface having a subregion that is used as a reflective optical element.

31. The projection objective according to claim 21, wherein said object plane is separated from said image plane by a distance of <700 mm.

32. The projection objective according to claim 21, wherein no more than five of said six reflective optical elements are of aspherical design.

33. The projection objective according to claim 32, wherein said six reflective optical elements include one member that is farthest from an optical axis of said projection objective and has a surface of spherical design.

34. The projection objective according to claim 21, further comprising a physical diaphragm that is positioned on or near a second reflective optical element.

35. The projection objective according to claim 21, further comprising an intermediate image that is formed after a fourth reflective optical element in said conjugated plane.

36. The projection objective according to claim 21, wherein said projection objective is a component of a projection exposure apparatus, wherein said projection exposure apparatus includes:
an illumination system;
a mask positioned on a first support system,
wherein said mask has a structure, and
wherein said mask is illuminated by said illumination system with radiation of a wavelength $\leq 193$ nm; and a light sensitive object positioned on a second support system,
wherein said projection exposure apparatus employs said projection objective for imaging said structure of said mask on said light-sensitive object.

37. The projection objective according to claim 36, wherein said projection exposure apparatus is employed for producing structural components by using a method that includes:
positioning a light-sensitive object on said second support system;
illuminating a structured mask using an illumination system;
imaging said structure of said mask on a light-sensitive object using said projection objective; and
exposing said light sensitive object with radiation of wavelength of $\leq 193$ nm.

38. The projection objective of claim 21, wherein each of said plurality of refractive optical elements has a used area that has a diameter that is less than 1/4th of a distance from said object plane to said image plane.

39. The projection objective of claim 21, wherein each of said plurality of refractive optical elements has a used area that has a diameter that is less than $1/5^{th}$ of a distance from said object plane to said image plane.

40. A projection objective for wavelengths $\leq 193$ nm, for imaging an object field in an object plane into an image field in an image plane comprising:
six reflective optical elements;
a plane conjugated to said object plane in which an intermediate image of said object field is formed;
a first sub-objective that includes a first subset of said six reflective optical elements positioned in a beam path from said object plane to said conjugated plane; and
a second sub-objective that includes a second subset of said six reflective optical elements positioned in said beam path from said conjugated plane to said image plane,
wherein said first sub-objective and said second sub-objective each have no more than three refractive optical elements, and
wherein said object plane is separate from said image plane by a distance of <700 mm.

41. The projection objective according to claim 40, further comprising a refractive optical element that has a lens surface having a subregion that is used as a reflective optical element.

42. The projection objective according to claim 40, wherein said refractive optical elements each comprise a lens material selected from the group consisting of an alkali-metal fluoride, an alkaline-earth fluoride, $CaF_2$, $BaF_2$, and LiF.

43. The projection objective according to claim 40, wherein said refractive optical elements are positioned centrally on an optical axis of said projection objective.

44. The projection objective according to claim 40, wherein no more than five of said six reflective optical elements are of aspherical design.

45. The projection objective according to claim 40, wherein said six reflective optical elements include one member that is farthest from an optical axis of said projection objective and has a surface of spherical design.

46. The projection objective according to claim 40, further comprising a physical diaphragm that is positioned on or near a second reflective optical element.

47. The projection objective according to claim 40, further comprising an intermediate image that is formed after a fourth reflective optical element in said conjugated plane.

48. The projection objective according to claim 40, wherein said projection objective is a component of a projection exposure apparatus, wherein said projection exposure apparatus includes:
a first support system for supporting a mask having a structure;
a second support system for supporting a light sensitive object; and
an illumination system for illuminating said mask with radiation of a wavelength $\leq 193$ nm,
wherein said projection exposure apparatus employs said projection objective for imaging said structure of said mask on said light-sensitive object.

49. The projection objective according to claim 48, wherein said projection exposure apparatus is employed for producing structural components by using a method that includes:
positioning a light-sensitive object on said second support system;
illuminating a structured mask using an illumination system;
imaging said structure of said mask on a light-sensitive object using said projection objective; and
exposing said light sensitive object with radiation of wavelength of $\leq 193$ nm.

50. The projection objective of claim 40, wherein said refractive optical elements each have a used area with a diameter of less than $1/4^{th}$ of a distance from said object plane to said image plane.

51. The projection objective of claim 40, wherein said refractive optical elements each have a used area with a diameter of less than $1/5^{th}$ of a distance from said object plane to said image plane.

52. A projection objective for wavelengths $\leq 193$ nm, for imaging an object field in an object plane into an image field in an image plane comprising:
six reflective optical elements;
a plane conjugated to said object plane in which an intermediate image of said object field is formed;
a first sub-objective that includes a first subset of said six reflective optical elements positioned in a beam path from said object plane to said conjugated plane; and a second sub-objective that includes a second subset of said six reflective optical elements positioned in said beam path from said conjugated plane to said image plane, wherein said first sub-objective and said second sub-objective each have no more than three refractive optical elements, and wherein two of said three refractive optical elements are positioned after a sixth reflective optical element in said beam path from said object plane to said image plane.

53. A projection objective for wavelengths $\leq 193$ nm, for imaging an object field in an object plane into an image field in an image plane comprising:

a first reflective optical element;

a second reflective optical element;

a third reflective optical element;

a fourth reflective optical element;

a fifth reflective optical element;

a sixth reflective optical element; and at least one refractive optical element, wherein said at least one refractive optical element has a used area with a diameter, wherein said diameter of said used area of said at least one refractive optical element is less than $\frac{1}{3}^{rd}$ of a distance from said object plane to said image plane, and wherein the projection objective has an image-side numerical aperture $\geq 0.65$, and wherein no more than five of six surfaces of said first, second, third, fourth, fifth and sixth reflective optical elements are of asperhical design.

54. The projection objective of claim 53, wherein said first, second, third, fourth, fifth or sixth reflective optical element that is farthest from said optical axis of said projection objective has a surface of spherical design.

55. A projection objective for wavelengths $\leq 193$ nm, for imaging an object field in an object plane into an image field in an image plane comprising:

a first reflective optical element;

a second reflective optical element;

a third reflective optical element;

a fourth reflective optical element;

a fifth reflective optical element;

a sixth reflective optical element; and at least one refractive optical element, wherein said at least one refractive optical element has a used area with a diameter, wherein said diameter of said used area of said at least one refractive optical element is less than $\frac{1}{3}^{rd}$ of a distance from said object plane, wherein the projection objective has an image-side numerical aperture $\geq 0.65$, and wherein said first, second, third, fourth, fifth or sixth reflective optical element that is farthest from said optical axis of said projection objective has a surface of spherical design.

56. A projection objective for wavelengths $\leq 93$ nm, for imaging an object field in an object plane into an image field in an image plane comprising:

six reflective optical elements;

a plane conjugated to said object plane in which an intermediate image of said object field is formed;

a first sub-objective that includes a first subset of said six reflective optical elements positioned in a beam path from said object plane to said conjugated plane; and a second sub-objective that includes a second subset of said six reflective optical elements positioned in said beam path from said conjugated plane to said image plane, wherein said first sub-objective and said second sub-objective each have no more than three refractive optical elements, and wherein said six reflective optical elements include one member that is farthest from an optical axis of said projection objective and has a surface of spherical design.

* * * * *